United States Patent
Schmid et al.

(10) Patent No.: US 7,421,177 B2
(45) Date of Patent: Sep. 2, 2008

(54) OPTOELECTRONIC COMPONENT AND METHOD FOR CONTROLLING TUNNELING ELECTRON CURRENTS BY MEANS OF PHOTONS

(75) Inventors: Günter Schmid, Velbert (DE); Ulrich Simon, Aachen (DE); Günter Schön, Ahrensberg (DE); Birgit Mellis, Düsseldorf (DE)

(73) Assignee: Universitat Duisburg-Essen, Essen (DE)

( * ) Notice: Subject to any disclaimer, the term of this patent is extended or adjusted under 35 U.S.C. 154(b) by 0 days.

(21) Appl. No.: 11/230,218

(22) Filed: Sep. 19, 2005

(65) Prior Publication Data
US 2006/0251366 A1 Nov. 9, 2006

(30) Foreign Application Priority Data
Sep. 20, 2004 (DE) ............. 10 2004 045 919
Oct. 14, 2004 (DE) ............. 10 2004 050 176

(51) Int. Cl.
*G02B 6/12* (2006.01)
(52) U.S. Cl. ............................. 385/129; 385/132
(58) Field of Classification Search ............. 385/129, 385/132
See application file for complete search history.

(56) References Cited

U.S. PATENT DOCUMENTS

| | | | |
|---|---|---|---|
| 5,350,930 A | | 9/1994 | Schmid et al. |
| 6,665,486 B2 * | | 12/2003 | Tomita .......... 385/147 |
| 7,010,183 B2 * | | 3/2006 | Estes et al. ..... 385/14 |
| 7,132,676 B2 * | | 11/2006 | Shields et al. .... 257/14 |
| 7,177,515 B2 * | | 2/2007 | Estes et al. ..... 385/130 |
| 2001/0016095 A1 * | | 8/2001 | Tomita .......... 385/15 |
| 2002/0070352 A1 * | | 6/2002 | Allan et al. ..... 250/492.1 |
| 2002/0196827 A1 * | | 12/2002 | Shields et al. .... 372/45 |
| 2003/0206708 A1 * | | 11/2003 | Estes et al. ..... 385/130 |

FOREIGN PATENT DOCUMENTS

EP  1 255 136 A2  11/2002

OTHER PUBLICATIONS

Chi, L.F. et al., "Single—electron tunneling In AU55 cluster monolayers", Appl. Phys., 1998, vol./Issue No. A66, pp. 187-190.

Del Alamo, J.A. et al., "Electron waveguides devices", Superlattices and Microstructures, 1998, vol./Issue No. 23/1, pp. 121-137.

Hergenrother, J.M. et al., "The Single-Electronc Transistor as an Ultrasensitive Microwave Detector", IEEE Transactions on Appl. Superconductivity, Jun. 2, 1995, vol./Issue No. 5/2.

(Continued)

*Primary Examiner*—K. Cyrus Kianni
(74) *Attorney, Agent, or Firm*—Woodard, Emhardt, Moriarty, McNett & Henry LLP

(57) ABSTRACT

An optoelectronic component with a photonic crystal, which also has an electronic band gap, and a method for controlling tunneling electron currents by means of photons are proposed. Essentially loss-free and very fast switching is enabled in that a photonic crystal has a defect mode in its photonic band gap for photons with such an energy that electron transitions, especially in the form of single-electron tunneling processes between adjacent ligand-stabilized metal clusters, can be induced by the irradiation of corresponding photons due to at least one defect site.

14 Claims, 3 Drawing Sheets

OTHER PUBLICATIONS

Joannopoulos, J.D. et al., "Photonic Crystals: Putting a New Twist on Light", Nature, Mar. 1997, vol./Issue No. 386, pp. 143-149.

Joannopoulos, John D. et al., "Phototonic Crystals Molding the Flow of Light", Princeton Univ. Press, 1995.

John, Sajeev, "Strong Localization of Photons in Certain Disordered Dielectric Superlattices", Phy. Rev. Letters, Jun. 8, 1987, vol./Issue No. 58/23, pp. 2486-2489.

Krauss, Thomas F. et al., "Photonic Crystals in the Optical Regime—Past, Present and Future", Prog. Quant. Electr., 1999, vol./Issue No. 23, pp. 51-96.

Qi, Minghao et al., "A three-dimensional optical phototonic crystal with designed points defects", Nature, Jun. 3, 2004, vol./Issue No. 4239, pp. 538-542.

Schmid, G. et al., "Large Transition Metal Clusters-VI. Ligand Exchange Reactions on AU55(PPh3)12CL6-The Formation of a Water Soluble Au55 Cluster", Polyhdron, 1998, vol./Issue No. 7/8 pp. 605-608.

Schmid, G. et al., "Au55[P(C6H5)3]12Cl6—eln Goldcluster ungewöhnlicher Größe", Chem. Ber., 1981, vol./Issue No. 114, pp. 3634-3642.

Schmid, Günter et al., "Metal Clusters and Colloids", Adv. Mater., 1998, vol./Issue No. 10/7, pp. 515-527.

Schön, G. et al., English Abstract "Die Kleinsten Electronischen Schalter—Clsuter aus 55 Goldatomen", Spektrum, Apr. 1994, pp. Abstract.

Schön, G. et al., "A Fascinating New Field in Colloid Science: Small Ligand-Stabilized Metal Clusters and Possible Application in Microelectronics, Part-I-State of the Art", Colloid. Polym. Sci., 1995, vol./Issue No. 273 pp. 101-117.

Schön, G. et al., Die Kleinsten Electronischen Schalter—Cluster aus 55 Goldatomen, Spektrum, Apr. 1994, pp. 22-24.

Schön, G. et al., "A Fascinating New Field in Colloid Science: Small Ligand-Stabilized Clusters and Possible Application in Microelectronics, Part II-Future Directions", Colloid. Polym. Sci., 1995, vol./Issue No. 273, pp. 202-218.

Simon, U.; "Charge Transport in Nanoparticle Arrangements", Adv. Mater., 1998, vol./Issue No. 10/17, pp. 1487-1492.

Simon, U. et al., "Electrical Properties of Chemically Tailored Nanoparticles and Their Application in Microelectronics", Handbook of Nanostructured Materials & Natotechnology, 2000, vol./Issue No. 3, pp. 131-178 Univer of Essen Essen DE.

Simon, U., et al., "Chemical Processes In Inorganic Materials: Meta and Semiconductor Clusters and Colloids", Mat. Res. Soc. Symp. Proc., 1992, vol./Issue No. 272, pp. 166-175.

Torma, V., et al., "Charge-Transfer Mechanisms between Gold Clusters", Eur. J. Inorg. Chem., 2003, pp. 1121-1127.

Villeneuve, Pierre R. et al., "Photonic Bandgaps In Perioidic Dielectric Structures", Prog. Quant. Electr., 1994, vol./Issue No. 18, pp. 153-200.

Yablonovitch, E. et al., "Photonic band-gap Structures", J. Opt. Soc. Am. B., Feb. 1993, vol./Issue No. 10/2, pp. 283-295.

Yablonovitch, Eli, "Inhibited Spontaneous Emission in Solid-State Physics and Electronics", Physical Review Letters, May 18, 1987, vol./Issue No. 58/20, pp. 2059-2062.

Zhang, Huijing et al., "Reduced Metallic Properties of Ligand-Stabilized Small Metal Clusters", Nano Letters, 2003, vol./Issue No. 3/3, pp. 305-307.

* cited by examiner

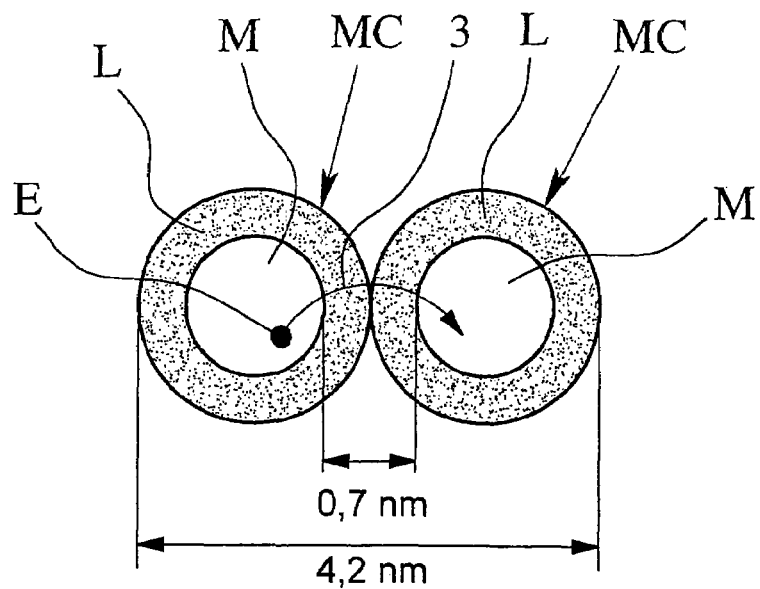
Fig. 3
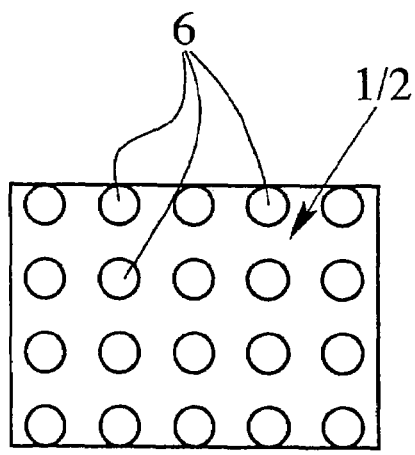 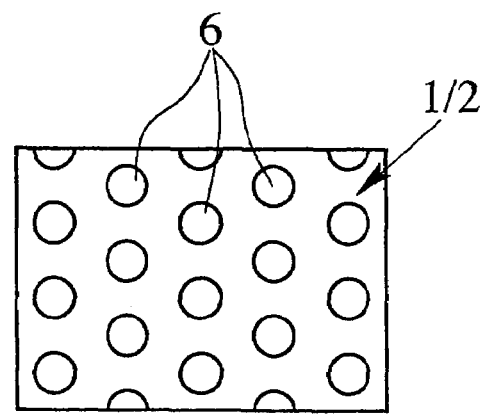
Fig. 4     Fig. 5

OPTOELECTRONIC COMPONENT AND METHOD FOR CONTROLLING TUNNELING ELECTRON CURRENTS BY MEANS OF PHOTONS

CROSS-REFERENCES TO RELATED APPLICATIONS

Applicant claims foreign priority benefits under 35 U.S.C. 19(a)-(d) of the following foreign applications for patent: German Application Nos. DE 10 2004 045 919.3, filed Sep. 20, 2004 and DE 10 2004 050 176.9, filed Oct. 14, 2004, which are hereby incorporated by reference in their entirety.

BACKGROUND OF THE INVENTION

1. Technical Field

The present invention relates to an optoelectronic component with a photonic crystal, which also features an electronic band gap and/or a tunneling electron path, as well as to a method for controlling tunneling electron currents by means of photons.

For a few years, materials under the term "photonic crystal" have been known and understood to be materials having an optical or photonic band gap for light, especially in the UV range up to the microwave range. Photons with energies within the band gap are completely reflected or cannot propagate in the crystal. Such behavior corresponds to that of electrons in crystalline solid bodies, which possess an electronic band gap between the valence and conduction bands. However, the term "photonic crystal" is understood to include not only crystals in the conventional sense, but also any other material that is, in particular, optionally non-monocrystalline or polycrystalline or any other structure with an optical or photonic band gap.

2. Related Art

Furthermore, in principle, it is already known to form defect sites in photonic crystals, in order to modify the optical properties and to enable, for example, localization or targeted conduction of photons in the photonic crystal. As an example, refer to the article "A three-dimensional optical photonic crystal with designed defect sites" by Minghao Qi et al., Nature, Volume 429, Jun. 3, 2004, pp. 285ff.

"Untersuchungen zur Erfassung und Modifikation von Bandlücken, drei-dimensionaler Photonischer. Kristalle basierend auf mit chemischen Quanten-punkten belegten Polymeren"

From [Studies on the detection and modification of band gaps of three-dimensional photonic crystals based on polymers coated with chemical quantum points] by Birgit Mellis, Shaker Verlag, Aachen 2004, ISBN 3-8322-2782-2, a photonic crystal is known, which also features tunneling electron paths in the photonic band gap. The crystal is constructed from polymer spheres with a diameter of approximately 200-800 nm, which are each surrounded by a shell made from ligand-stabilized $AU_{55}$ nanoclusters, so that tunneling electron paths are formed between the gold clusters.

The formation of tunneling electron paths between gold clusters is basically already known from U.S. Pat. No. 5,350,930 A. Here, nano-quantum channels are formed from at least two adjacent clusters. Preferably, bulk material from the clusters is used, which are pressed together. The clusters each feature a metallic cluster nucleus and an insulating ligand shell. The cluster nuclei each feature, in particular, 55 gold atoms in closest sphere packing and form, in particular, quantum wires.

A lot of research has been performed in the field of metal clusters, especially with 55 gold atoms. As an example, refer to the following articles: "Single-electron tunneling in $AU_{55}$ cluster monolayers" by L. F. Chi et al., Appl. Phys. A 66, pp. 187-190 (1998); "Metal Clusters and Colloids," Günter Schmid et al., Adv. Mater. 1998, 10, No. 7; "Reduced Metallic Properties of Ligand-Stabilized Small Metal Clusters," Huijing Zhang et al., NANO LETTERS 2003, Vol. 3, No. 3, [pp.] 305-307.

BRIEF SUMMARY OF THE INVENTION

The present invention is based on the object of providing an optoelectronic component and a method for controlling tunneling electron currents by photons, which enables use at room temperature, the realization of a component that generates particularly low heat losses or that can be miniaturized particularly well, fast switching, and/or allows for economical production.

The above object is achieved by an optoelectronic component according to what is disclosed and claimed herein. Advantageous refinements are the subject matter of the subordinate claims.

A fundamental idea of the present invention is to provide at least one defect site for a photonic crystal, which also features an electronic band gap, especially in the form of at least one tunneling electron path, so that, in the photonic crystal, a defect mode is present in its optical band gap for photons with such an energy that electron transitions, especially single-electron transitions, can be induced via tunneling paths. In particular, according to the method it is provided that for adjacent metal clusters, a tunneling electron current is induced or controlled by the irradiation of photons.

Thus, it is possible, for example, to trigger or to control electron transitions, especially single-electron transitions or tunneling processes, through the irradiation of photons in defect mode. These quantum microelectronics, especially with single-electron tunneling transitions, open up great opportunities for ultra-high degrees of miniaturization and increases in performance of the microelectronics. Thus, fast switching, that is, fast electron transitions, is enabled, virtually with no loss, thus, at least with minimal heat loss. Furthermore, the photons used here for control have great advantages in comparison with electrons or conventional electronics due to their fast and undisturbed propagation in media and the resulting higher transfer of information per unit time.

The component according to the proposal can also be operated at room temperature. In particular, the component can be used in a computer or the like, preferably without cooling at temperatures that prevail there, which, in a broader sense, are also to be understood as room temperature. However, if necessary, cooling, for example, by a fan, can also be provided. In addition, the component can also be operated at lower temperatures, for example, by cooling with liquid nitrogen.

BRIEF DESCRIPTION OF THE SEVERAL VIEWS OF THE DRAWINGS

Additional advantages, features, properties, and aspects of the present invention emerge from the following description of preferred embodiments with reference to the drawing. Shown are:

FIG. 3 is a schematic view of two coated metal clusters, which form a tunneling electron path in the photonic crystal.

FIG. 4 is a schematic view of a square pore lattice of the photonic crystal.

FIG. 5 is a schematic view of a hexagonal pore lattice of the photonic crystal.

DETAILED DESCRIPTION OF THE INVENTION

Figure 1:
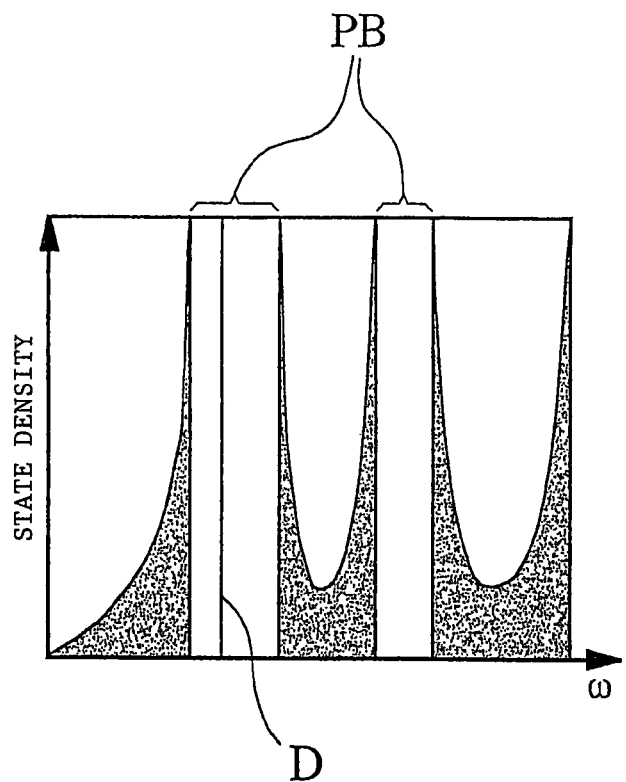
FIG. 1 is a state density diagram of a photonic crystal with a defect mode.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

In the figures, the same reference numbers are used for the same or similar parts, with corresponding or similar advantages and properties being achieved, even if repeated description has been left out for reasons of simplification.

In a merely schematic diagram, FIG. 1 shows the photonic state density of a photonic crystal in the sense named above, which, in the illustrated example, features two photonic band gaps PB. The state density is recorded versus frequency. The band gaps PB are in the UV range up to the microwave range, in particular, the wavelengths of the photonic band gap(s) PB can be approximately 10 nm up to or even above 400 μm.

In addition, indicated by the vertical line D, FIG. 1 shows a defect mode or a defect state in the region of the first photonic band gap PB. Due to at least one corresponding defect, this state D exists within the band gap PB, so that photons in this state D or in the defect mode are captured by the photonic crystal or can be localized in this crystal or, if necessary, can be generated. In particular, photons in the defect mode D, thus with the energy of the state D, are not reflected like other photons irradiated onto the photonic crystal with energies within the band gap PB.

The defect mode D for the photons or at least one photon within the photonic band gap PB is essential for the present invention and will become clear from the further description with reference to the other figures.

Figure 2:
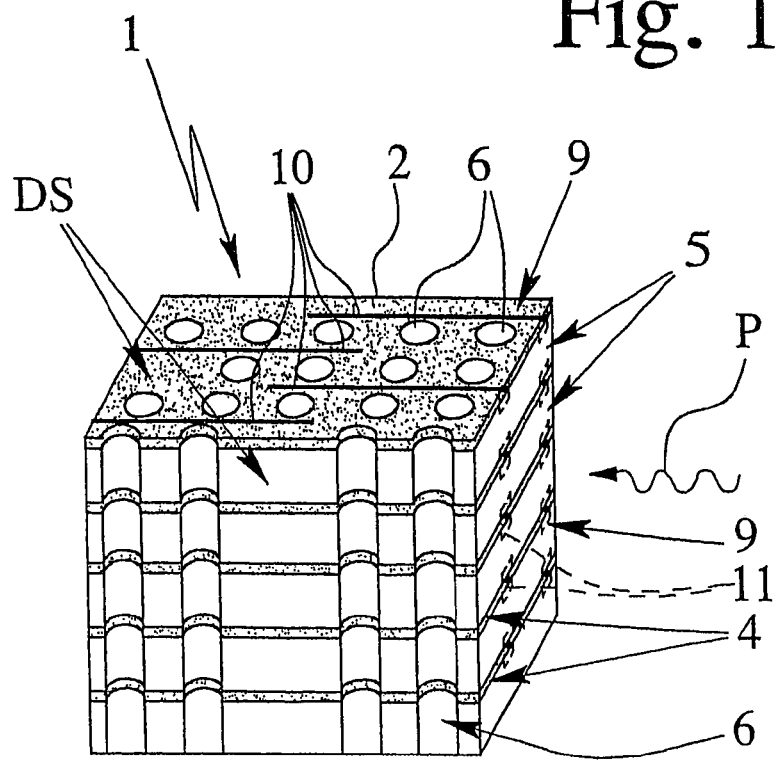
FIG. 2 is a schematic view of an optoelectronic component according to the proposal with a photonic crystal according to a first embodiment.

In only a very schematic illustration (not to scale!), FIG. 2 shows an optoelectronic component 1 according to the proposal according to a first embodiment. The component 1 has a photonic crystal 2 in the sense named above; thus the crystal 2 has at least one photonic band gap PB. In addition, the crystal 2 has an electronic band gap.

In the illustrated example, the electronic band gap is formed by at least one tunneling electron path, preferably by several tunneling electron paths, wherein the photonic crystal 2 is otherwise constructed to be at least essentially electrically insulating to the necessary extent.

In the illustrated example, the tunneling electron paths are formed by adjacent clusters MC, which are preferably coated by ligands and which abut each other. FIG. 3 shows as an example in a schematic illustration, two adjacent metal clusters MC, which form such a tunneling electron path between themselves, as indicated schematically by the electron transition in the form of the arrow 3. Thus, an electron E can tunnel from one cluster nucleus M to another cluster nucleus M through the two separating or insulating shells L.

Thus, the shells L represent the walls of two potential wells for electrons E. In principle, electrons E can tunnel through the tunnel barrier, which is at least essentially 0.7 nm thick in the illustrated example, from one cluster nucleus M to the next cluster nucleus M when a voltage is applied. The tunneling energy is preferably greater than k·T (k=Boltzmann's constant; T=operating temperature) and equals, particularly at room temperature, essentially 0.025 to 2.0 eV, preferably essentially 0.3 eV.

The cluster nucleus M preferably consists of a transition metal or metal of the platinum group, especially gold. Each cluster nucleus M consists of several metal atoms, especially at least 10 and/or a maximum of a few 100 metal atoms, particularly much preferred 55 metal atoms, which are arranged, in particular, in multiple shells in closest sphere packing.

However, the cluster nuclei M can also be constructed from a different number of atoms, especially if each cluster nucleus M consists of several or different transition metals.

The size of the cluster nuclei M preferably equals a maximum of approximately 2.5 nm, especially a maximum of approximately 2.0 nm, particularly preferably a maximum of 1.6 nm and at least approximately 0.5 nm, especially at least approximately 1.0 nm, particularly preferably at least approximately 1.3 nm. It is particularly preferred that the average size of the cluster nuclei M lie in the range from approximately 1.3 nm to approximately 1.5 nm.

The cluster shell L is preferably constructed to be electrically insulating and is constructed from organic compounds. However, the cluster shell L can also be formed, for example, from inorganic compounds and/or from a different metal or material.

Preferably, the cluster shell L consists of suitable ligands, for example, from organic residues or halogens, especially chlorine. Examples for suitable organic compounds are triphenylphosphine and its derivatives. However, it is also possible to use other types of ligand systems for coating.

The clusters MC, thus cluster nucleus M and cluster shell L, preferably have an average diameter of 0.1 to 10 nm, especially 2 to 3 nm, particularly much preferred approximately 2.1 nm.

In the illustrated example, gold clusters, especially with essentially 55 gold atoms, are used. The shells L of the cluster nucleus M are formed by suitable ligand systems, preferably non-covalent bond ligand systems, for example, made from triphenylphosphine.

Particularly preferred are clusters MC with the following formula:

$$AU_{55}[P(C_6H_5)_3]_{12}Cl_6$$

or

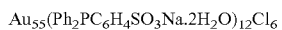

$$Au_{55}(Ph_2PC_6H_4SO_3Na.2H_2O)_{12}Cl_6$$

The production of the clusters MC can be taken from the literature without anything further. In particular, in this respect refer to the articles and publications mentioned in the introduction, as well as to the locations cited therein. Incidentally, the clusters MC can also be purchased in a modified form (with different cluster shells L) without anything further, for example, under the trade name NANOGOLD® from the company Nanoprobes, Inc., USA.

The previously explained, coated clusters MC or other inclusions or structures are arranged, in the first embodiment according to FIG. 2, in monolayers or multiple layers 4, which are coated alternately with intermediate layers 5.

The intermediate layers 5 are electrically insulating and/or at least essentially transparent for photons. Preferably, the intermediate layers 5 consist of inorganic oxide, especially $TiO_2$, $SnO_2$, silicate, or silicon dioxide, or another, preferably element-pure material, such as germanium or silicon. However, for example, plastic, such as PMMA, polystyrene, or the like, can also be used.

In the illustrated example, the thickness of the intermediate layers equals 10 to a few 100 nm, especially essentially 20 to 80 nm.

In contrast, the thickness of the layers 4 equals only a few nm, especially less than 20 nm, and preferably essentially approximately 10 nm or less.

In the illustrated example, the component 1 or its photonic crystal 2 is provided with especially cylindrical pores 6, which run transverse, preferably perpendicular, to the layers 4, but if necessary, also parallel only in the intermediate layers 5. The lattice spacing or center-to-center spacing of the pores 6 is preferaly equal to approximately the half or the full wavelength or between the half and full wavelength of the defect mode D, especially at room temperature, 0.2 to 50 μm, in the illustrated example, preferably 1 to 7 μm, advantageously essentially 2 to 5 μm. The pore diameter equals preferably 0.1 to 25 μm, especially essentially 1 to 2 μm in the illustrated example. The pores 6 can be generated, for example, by so-called pore etching or any other suitable way. The pores 6 can be filled or evacuated with air or another medium or agent.

Through the pores 6, the desired photonic band gap PB is generated in the crystal 2. In the illustrated example, the photonic band gap PB lies in the range from 0.1 to 0.5 eV, especially approximately in the range from 0.2 to 0.4 eV. According to the requirements, through the corresponding selection of spacing and diameter of pores 6, an optical band gap can be generated in the desired energy range.

FIG. 4 shows as an example a square lattice of the pores 6 in a schematic plan view (without defect sites). FIG. 5 shows as an example a hexagonal lattice of the pores 6 in a schematic plan view (without defect sites).

FIG. 2 shows further that the optoelectronic component 1 or the photonic crystal 2 has at least one defect site DS (in the illustrated example two defect sites DS) through the elimination of pores 6. The defect sites DS can also be formed as an addition or alternative to eliminating individual pores 6, such that individual pores 6 deviate in diameter from the other pores 6 and/or are filled with a different medium.

Through the defect site or sites, DS, the defect mode, D (as already indicated and discussed in FIG. 1), is formed in the photonic band gap PB. The energy of the defect mode D is preferably selected such that electron transitions 3 can be induced by photons in the defect mode D, thus especially electron tunneling processes or, if necessary, electron excitations from the valence band to the conduction band, for example, as in a semiconductor.

For the irradiation of a photon P of suitable energy, hence in the defect mode D, the photon P can be localized at the defect sites DS in the photonic crystal 2 or captured by these defect sites and directly or with a delay induce a tunneling process of a single electron E, thereby causing an electron transition 3.

Such an electron transition 3 can be detected preferably by electrodes or electrical terminals 9 of the component 1, indicated in FIG. 2 and explained in more detail at the end of the description, directly or indirectly, for example, by the application of a voltage or through a current measurement. Consequently, the electronic properties of the component 1 can be changed selectively by the action of photons P, in particular, switching functions can be executed.

For the irradiation of light or photons P in the defect mode D, for example, tunneling processes are induced, so that when an external potential is applied, a directed tunnel current flows and an output signal can be output. If there is no corresponding light irradiation, no tunnel current flows and no output signal is generated.

Alternatively or additionally, a shift or change of the photonic band gap PB and/or the electronic band gap is possible, especially through external influences, for example, through a strong external electric field or magnetic field, pressure, or the like, in order, for example, to allow no tunnel current to flow or to delay it despite the application of an external potential and corresponding light irradiation, thus, for example, to output no output signal until the external influences are turned off, or to initiate electron pumping processes, for example, for an electron laser, or in order, for example, to approximate or equalize the required energies of the defect mode D or for the tunneling processes in the desired way.

The optoelectronic component 1 according to the proposal can be operated with very low heat loss and therefore can be integrated, and thus miniaturized, quite well. Through the light or the photons P and/or the fast tunneling processes, very fast switching is enabled. In addition, the component 1 according to the invention can be manufactured economically with relatively simple methods and can be operated at room temperature.

Instead of several layers 4, the component 1 according to the invention can also have, if necessary, merely a single layer 4.

For generating the defect sites DS, as an alternative or in addition to the modification of the pores 6, modifications to the inclusions or structures in the layers 4, especially a modification or change of the clusters MC in the desired areas of the defect sites DS, can be used.

The electronic band gaps of the photonic crystal 2 is formed particularly exclusively by at least one tunneling electron path in the illustrated example. If necessary, the photonic crystal 2 can have an electronic band gap or tunneling electron path(s) only in certain areas and can otherwise be structured, for example, electrically insulating. However, in principle, other suitable materials can also be used in constructions for generating the electronic band gap, especially for generating the preferably provided tunneling electron path(s). As an alternative or in addition to the tunneling electron paths provided in the illustrated example, the photonic crystal 2, if necessary also only in certain areas, can feature the properties of an electrical semiconductor, thus with a valence band and conduction band for electrons E.

Figure 6:
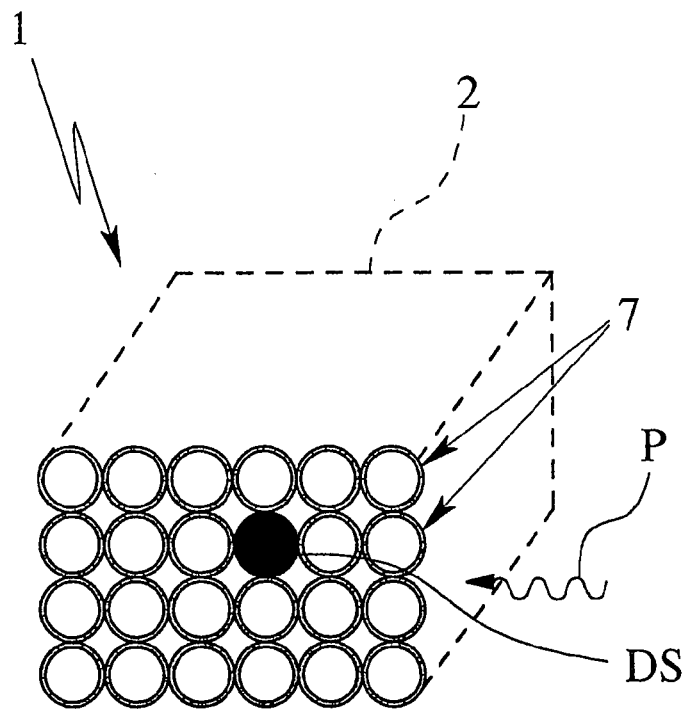
FIG. 6 is a schematic view of an optoelectronic component according to the proposal with a photonic crystal according to a second embodiment.

In a very schematic illustrated example (not to scale!), FIG. 6 shows a second embodiment of the component 1 according to the proposal with the photonic crystal 2. In the following, only essential differences in comparison with the first embodiment are emphasized, otherwise at least essentially the same or corresponding properties and advantages as in the first embodiment emerge.

The second embodiment is distinguished in that the photonic crystal 2 is constructed essentially from preferably sphere-like structures 7 or other structures.

Figure 7:
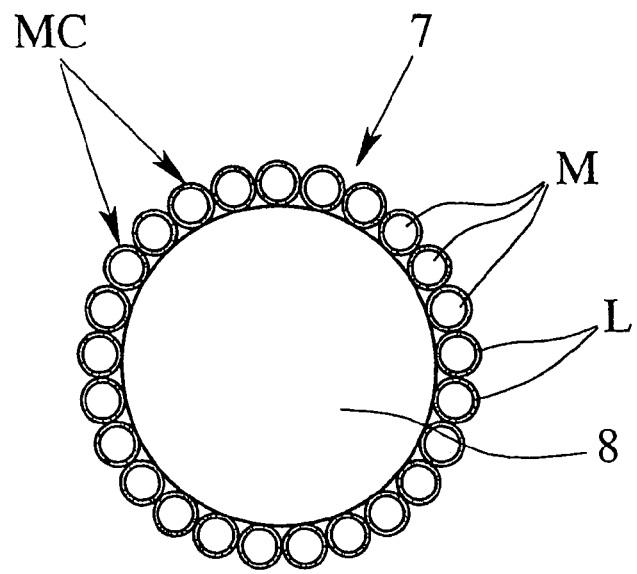
FIG. 7 is a schematic sectional view of a spherical structure with ligand-coated metal clusters of the photonic crystal according to FIG. 6.

In a quite schematized, section-like illustration, FIG. 7 shows a structure 7 of the photonic crystal 2 according to the second embodiment. In the illustrated example, a preferably polymer nucleus 8, especially made from polystyrene or the like, is coated in one or more layers with the clusters MC already described above in the first embodiment or comparable, coated clusters, especially by colloidal deposition of ligand-stabilized metal clusters MC on the nucleus surface and/or corresponding binding of MC clusters on the nucleus surface. An incomplete coating or covering of the nucleus surface with clusters MC is sufficient as long as the desired tunneling electron paths are formed in the crystal 2. Preferably, the production is realized according to the information in this respect in the book already named above "Untersuchungen zur Erfassung und Modifikation von Bandlücken drei-dimensionaler Photonischer. Kristalle basierend auf mit Chemischen Quanten-punkten belegten Polymeren"

as well as the parts cited.

Instead of polystyrene, other suitable polymers or plastics, such as PMMA, or other materials, can also be used for the nuclei 8. As an alternative material for the nuclei 8, there are, in particular, also inorganic oxide, especially silicon dioxide, $TiO_2$, $SnO_2$, or silicate, or the like, or also a very pure material. Alternatively, the nuclei 8 can also be formed as cavities, especially so-called inverse opal structures.

In addition, other clusters MC or arrangements instead of the preferably provided gold clusters can also be used for forming the quantum points, in the first embodiment in the layers 4 and in the second embodiment on the nucleus surface.

The size of the structures 7 is preferably at least essentially uniform and lies especially in the μm or nm range, preferably it equals approximately the half or the full wavelength or between the half and the full wavelength of the defect mode D, especially at room temperature from 0.2 to 50 μm. Preferably, the average diameter of the structures 7 equals essentially 2 to 4.5 μm in the illustrated example.

The photonic crystal 2 can also feature heterostructures as structures 7. In particular, structures 7 of various sizes, configurations, shapes, etc. can thus form individual layers 4 or parts of layers 4 or other spatial areas.

The structures 7 are arranged for forming the photonic crystal 2 in a sphere packing, especially very close sphere packing, or in any other suitable configuration. The resulting lattice spacing or center-to-center spacing preferably equals approximately the half or the full wavelength or between the half and the full wavelength of the defect mode D, especially approximately from 0.2 to 50 μm, preferably 2 to 4.5 μm, and generates a photonic band gap PB in the near IR range. Pores 6 or the like are thus not necessary in the second embodiment.

However, in the second embodiment, defect sites DS are also provided, in order to enable localization or capture of photons P irradiated from the periphery of the component 1 or generated in the crystal 2 or component 1 with an energy corresponding to the defect mode D. In the illustrated example for operation at room temperature, this energy of the relevant photons P preferably equals, in turn, about 0.025 to 2 eV, especially approximately 0.3 eV. Precisely this energy is required or used for exciting single electrons E in the clusters MC, that is, for overcoming the potential barriers (shells L between the cluster nuclei M), thus for tunneling from one cluster nucleus M to the next cluster nucleus M.

In the second embodiment, the generation of the defect sites DS is realized preferably such that individual, if necessary, also several sticking or adjacent structures 7 or nuclei 8 and/or their shells are different from the others in terms of their construction, their components, their structure, and/or their size or they are completely missing. In FIG. 6, as an example, a defect site DS is indicated by the blackened sphere structure 7. Additional defect sites DS can be formed in the spatially extending, thus preferably three-dimensional, photonic crystal 2 in the second embodiment.

Instead of an essentially spherical shape, the structures 7 obviously can also have other suitable shapes and can be formed, for example, as multi-faceted bodies or the like. In particular, they can be colloidal structures, which do not feature absolutely perfect symmetries. Alternatively, if necessary the nuclei 8 can also be eliminated or removed at a later time, replaced or modified, and formed with the clusters MC, especially so-called inverse opal structures.

The layers 4 of the first embodiment can also be constructed or formed, if necessary, from the sphere structures 7. In this case, the pores 6 can then be completely eliminated also in the first embodiment. The defect sites DS can then be formed, for example, according to the second embodiment.

In the following, possibilities are explained with reference to FIG. 2 for the electrical connection or the electrical detection of electron transitions 3. In principle, this also applies correspondingly for the second embodiment.

The component 1 has electrodes or other electrical terminals 9, which enable detection, preferably of single-electron transitions 3, thus especially of single tunneling electrons. For example, the electrodes or terminals 9 include electrical connections or conductive tracks 10 in the individual layers 4. The connections or conductive tracks 10 are preferably formed such that the properties of the photonic crystal 2 are essentially undisturbed. For example, the connections or conductive tracks 10 can extend like a comb and/or from opposite sides into the corresponding layer 4.

In particular, if each individual layer 4 is formed from multiple layers of clusters MC, through vaporization of the shells L, solid metal wires, especially gold wires, (so-called nanowires or whiskers) are generated in the layers 4. The vaporization can be realized, for example, by means of an electron or laser beam, which is guided accordingly. These conductive tracks 10 are formed layer-by-layer in production, many or only one in each layer 4 in adapted lengths, preferably always reaching up to the edge or to the side surface of the photonic crystal 2 and arranged at the desired spacing. Preferably, the conductive tracks 10 are guided or applied so that these are not interrupted by later pores 6.

In the illustrated example, the conductive tracks 10 in the individual layers preferably form so-called comb electrodes, which engage in each other alternately, whereby a mutual capacitive coupling and a corresponding addressing is enabled.

The connections or conductive tracks 10 are then connected electrically to all or individual or selected side connection or output points, for example, individually or in the shape of a matrix. This can be realized, for example, by contact points or surfaces, preferably made from gold or also through monolayers or multiple layers of clusters MC or cluster nuclei M. The coating can be realized, for example, through vaporization or sputtering, but also through sedimentation or the like.

The conductive tracks 10 or the contact points or surfaces connected thereto can then be addressed galvanically individually or connected electrically or also connected to each other.

However, instead of a galvanic coupling, a capacitive coupling is also possible. For this purpose, for example, a dielectric layer is generated on the output points of the conductive tracks 10 or above their side contact points or surfaces, on which preferably counter electrodes 11 can be applied, as shown by dashed lines in FIG. 2 from the right side surface. Especially for the previously mentioned capacitive coupling, for example, a frequency-dependent scanning, for example, by means of impedance or modulus spectroscopy, is possible.

The number, the spacing, and the position of the connection or output points of the conductive tracks 10 or their contact points or surfaces in the corresponding layer 4 permit the detection of photonic crystal areas in a desired dimension or plane of the photonic crystal 2.

According to the configuration, the terminal points of the conductive tracks 10 or their contact points or surfaces of various layers 4 can be connected to each other or connected or scanned by correspondingly dimensioned counter electrodes 11. This also applies to the galvanic and also the purely capacitive coupling. Correspondingly, the counter electrodes 11 can cover at least one monolayer or multiple layers of clusters MC and especially also several layers 4.

If necessary, the connections or conductive tracks 10 can also be partially or completely eliminated in the individual layers 4. Also adequate are side contact surface grids or contact points or surfaces or counter electrodes 11, in turn, made from metal or from clusters MC or cluster nuclei M, which are arranged on the outside on the completed photonic crystal 2. In this case then there are no good electrically conductive tracks 10 in the individual layers 4, but the (single) electrons of conductive layers 4 can be sufficient for the desired detection of electron transitions 3.

In the second embodiment of the photonic crystal 2 according to FIG. 6, a multi-dimensional electrode arrangement and scanning is possible accordingly.

Instead of electron transitions 3 or an electron conduction, if necessary, also transitions or conduction by holes can be considered.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

The invention claimed is:

1. An optoelectronic component including a photonic crystal having a photonic band gap, said photonic crystal comprising at least one of an electronic band gap and a tunneling electron path, wherein said photonic crystal comprises a defect mode being within said photonic band gap due to at least one defect site, said defect mode being in said photonic band gap for photons with such an energy as to induce at least one electron transition;
   wherein said photonic crystal includes structures constructed and arranged to form potential wells for electrons or electronic holes;
   wherein said structures include metal clusters; and
   wherein said metal clusters are ligand-stabilized.

2. The optoelectronic component of claim 1, wherein the component has at least one tunneling electron path forming said electronic band gap.

3. The optoelectronic component of claim 1, wherein the optoelectronic component is constructed and arranged such that at least one of an electron tunneling process and an electron excitation from the valence band to the conduction band can be induced in form of said at least one electron transition.

4. The optoelectronic component of claim 1, wherein said optoelectronic component is constructed and arranged such that said at least one electron transition can be controlled by incoming photons in said defect mode.

5. The optoelectronic component of claim 1, wherein said photonic crystal is formed from said structures.

6. The optoelectronic component of claim 1, wherein adjacent metal clusters form said tunneling electron path.

7. The optoelectronic component of claim 1, wherein said structures are arranged in at least one of mono layers, multiple layers, rows and paths.

8. The optoelectronic component of claim 7, wherein said layers of said structures are stacked alternately with intermediate layers.

9. The optoelectronic component of claim 8, wherein said intermediate layers are at least one of electrically isolating and substantially transparent to photons.

10. The optoelectronic component of claim 1, wherein said structures have nuclei.

11. An optoelectronic component including a photonic crystal having a photonic band gap, said photonic crystal comprising at least one of an electronic band gap and a tunneling electron path, wherein said photonic crystal comprises a defect mode being within said photonic band gap due to at least one defect site, said defect mode being in said photonic band gap for photons with such an energy as to induce at least one electron transition;
    wherein said photonic crystal includes structures constructed and arranged to form potential wells for electrons or electronic holes;
    wherein said structures have nuclei; and
    wherein said nuclei are at least one of colloid nuclei or polymer nuclei.

12. The optoelectronic component of claim 11, wherein said nuclei are coated by metal clusters.

13. The optoelectronic component of claim 12, wherein said coated nuclei form the photonic crystal.

14. The optoelectronic component of claim 11, wherein said nuclei have a diameter of essentially 0.2 to 50 μm.

* * * * *

UNITED STATES PATENT AND TRADEMARK OFFICE
CERTIFICATE OF CORRECTION

PATENT NO.        : 7,421,177 B2                                              Page 1 of 1
APPLICATION NO.   : 11/230218
DATED             : September 2, 2008
INVENTOR(S)       : Schmid et al.

It is certified that error appears in the above-identified patent and that said Letters Patent is hereby corrected as shown below:

Column 1,
    Line 10, replace "19(a)-(d)" with -- 119(a)-(d) --.

Signed and Sealed this

Twenty-first Day of April, 2009

JOHN DOLL
*Acting Director of the United States Patent and Trademark Office*